United States Patent [19]
Kim

[11] Patent Number: 5,790,257
[45] Date of Patent: Aug. 4, 1998

[54] ALIGNMENT DEVICE FOR AN EXPOSURE SYSTEM USING A CCD CAMERA

[75] Inventor: Sang-Cheol Kim, Kyeonggi-do, Rep. of Korea

[73] Assignee: Samsung Aerospace Industries, Ltd., Kyungsangnam-do, Rep. of Korea

[21] Appl. No.: 720,001

[22] Filed: Sep. 27, 1996

[30] Foreign Application Priority Data

Sep. 28, 1995 [KR] Rep. of Korea ............... 1995-32437

[51] Int. Cl.⁶ .................................................. G01B 11/27
[52] U.S. Cl. ................................................... 356/401
[58] Field of Search ........................................ 356/401

[56] References Cited

U.S. PATENT DOCUMENTS

| | | | |
|---|---|---|---|
| 4,710,029 | 12/1987 | Katoh | 356/401 |
| 4,937,459 | 6/1990 | Ina | 356/401 |
| 5,298,988 | 3/1994 | Everett et al. | 356/401 |
| 5,392,115 | 2/1995 | Oshida et al. | 356/401 |
| 5,493,403 | 2/1996 | Nishi | 356/401 |
| 5,521,036 | 5/1996 | Iwamoto et al. | 356/401 |
| 5,602,620 | 2/1997 | Miyazake et al. | 356/401 |

*Primary Examiner*—Frank G. Font
*Assistant Examiner*—Zandra V. Smith
*Attorney, Agent, or Firm*—Finnegan, Henderson, Farabow, Garrett & Dunner, L.L.P.

[57] ABSTRACT

An alignment device for an exposure system using a CCD camera is disclosed. The alignment device includes a plurality of optical alignment systems, a screen, a prism, an image formation lens, a CCD (Charge Coupled Device) camera, an image processor, an information display, and a stage controller. The alignment device can precisely align the position of a workpiece by varying the magnification of alignment light emitted from the plurality of optical alignment systems. This is done by transmitting the light through the prism, through the zoom lens and then to the single CCD camera where an image is formed.

7 Claims, 6 Drawing Sheets

ALIGNMENT DEVICE FOR AN EXPOSURE SYSTEM USING A CCD CAMERA

BACKGROUND OF THE INVENTION

A. Field of the Invention

The present invention relates to an alignment device for an exposure system using a CCD (Charge Coupled Device) camera. More particularly, the present invention relates to an alignment device for an exposure system using a CCD camera which can precisely align the position of a workpiece.

B. Description of the Prior Art

Generally, a plurality of CCD cameras have been used to align a pattern, which is to be exposed, to a precise position in an exposure system. In these systems, the patterns are inscribed on a reticle on a semiconductor wafer or on a liquid crystal display substrate.

When a plurality of CCD cameras are used, as described above, the position of an alignment mark for positioning the pattern to be exposed is obtained by first setting the lens to low magnification in order to search for the alignment mark. After the alignment mark is first obtained, the lens is set to high magnification to precisely position the pattern to be exposed. This requires that a plurality of optical alignment systems be separately mounted in each CCD camera.

The magnification of the lens attached to the CCD camera is varied by mounting an additional lens in the optical alignment system. For example, when a Nikon Company CCD is used, an additional lens is inserted or removed to vary the magnification of an image. Accordingly, manufacturing costs increase and the construction of the camera is complex since the additional lens for varying the magnification should be mounted in each of the plurality of CCD cameras as described above.

SUMMARY OF THE INVENTION

Accordingly, the object of the present invention is to provide an alignment device for an exposure system using a CCD camera which can precisely align the position of a workpiece by varying the magnification of an alignment light.

According to a first embodiment of the invention, an alignment device for an exposure system is disclosed, comprising a plurality of optical alignment systems, each alignment system producing an alignment light through an optical path. The alignment light corresponds to an alignment mark formed on a workpiece. Also included is a screen on which a reference mark is formed, the reference mark corresponding to an alignment position of the workpiece. A prism, having a plurality of reflective surfaces, reflects the plurality of alignment lights and produces the alignment lights on the screen. An image formation lens then forms an image from the alignment lights passing through the screen, the image corresponding to the reference mark and the alignment mark. A CCD camera converts the alignment lights, which are incident through the image formation lens, into corresponding image information and produces an image signal. An image processor produces a position signal corresponding to a position change of the workpiece after calculating a difference between the reference mark and the alignment mark according to image information produced from the CCD camera. An information display displays information corresponding to an image signal produced from the image processor. Finally, a stage controller moves a stage on which the workpiece is placed according to the position signal produced from the image processor.

According to a second embodiment of the invention, an alignment device for an exposure system is disclosed comprising a plurality of optical alignment systems, each having an operation state that is selectively changed, and a light source producing an alignment light through one optical path. The alignment light corresponds to an alignment mark formed on a workpiece. Also included is a screen on which a reference mark is formed, the reference mark corresponding to an alignment position of the workpiece. An image formation lens forms an image from the alignment lights passing through the screen, the image corresponding to the reference mark and the alignment mark. A CCD camera converts the alignment lights, which are incident through the image formation lens, into corresponding image information to produce an image signal. An image processor produces a position signal corresponding to a position change of the workpiece after calculating a difference between the reference mark and the alignment mark according to image information produced from the CCD camera. An information display displays information corresponding to an image signal produced from the image processor. Finally, a stage controller moves a stage on which the workpiece is placed according to the position signal produced from the image processor.

According to a third embodiment of the invention, an alignment device for an exposure system is disclosed comprising a plurality of optical alignment systems having an operational state that is selectively changed, each of the systems producing an alignment light through one optical path. The alignment light corresponds to an alignment mark formed on a workpiece. Also included is a screen on which a reference mark is formed, the reference mark corresponding to an alignment position of the workpiece. A pentaprism directs the alignment light produced from a plurality of optical alignment system on the screen through one optical path. An image formation lens forms an image from the alignment lights passing through the screen, the image corresponding to the reference mark and the alignment mark. A CCD camera converts the alignment lights, which are incident through the image formation lens, into corresponding image information and produces an image signal. An image processor produces a position signal corresponding to a position change of the workpiece after calculating a difference between the reference mark and the alignment mark according to image information produced from the CCD camera. An information display displays information corresponding to an image signal produced from the image processor. Finally, a stage controller moves a stage on which the workpiece is placed according to the position signal produced from the image processor.

Additional objects and advantages of the invention are set forth in part in the description which follows. Other features of the invention will be obvious from the following description when read in conjunction with the accompanying drawings, or may be learned by practice of the invention.

DESCRIPTION OF THE PREFERRED EMBODIMENTS

Reference will now be made in detail to the preferred embodiments of the present invention, examples of which are illustrated in the accompanying drawings.

Figure 1:
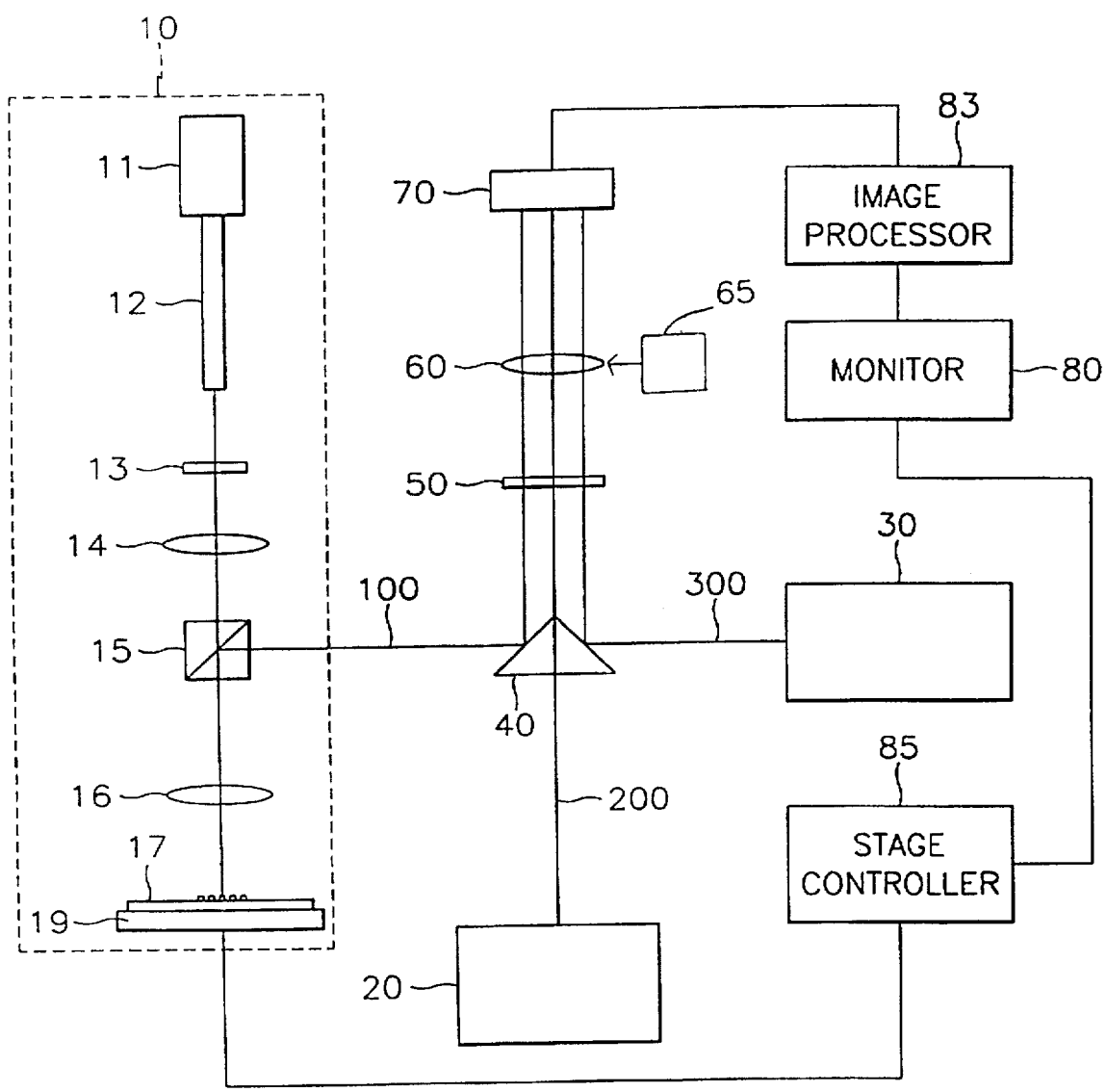
FIG. 1 is a perspective view illustrating an alignment device for an exposure system using a CCD camera in accordance with a first preferred embodiment of the present invention.

Referring to FIG. 1, an alignment device for an exposure system using a CCD camera in accordance with the first preferred embodiment of the present invention is shown. The alignment device includes a plurality of optical alignment systems 10, 20 and 30 each emitting alignment lights 100, 200 and 300, respectively, to a prism 40. The prism 40 has a plurality of reflective surfaces for reflecting the plurality of alignment lights which are incident to each reflective surface.

A screen 50, on which a reference mark is formed, receives the alignment lights emitted from the prism 40, and passes the lights on to an image formation lens 60.

The lens 60 forms an image from the lights passing through the screen 50. A CCD camera 70 converts the light emitted through the image formation lens 60 into an electric signal and produces an image signal. An image processor 83 then processes the image signal produced from the CCD camera 70 to produce image data and position information corresponding to the processed image data. A monitor 80 is also provided for displaying the image data produced from the image processor 83. The position information output from the image processor 83 is provided to a stage controller 85. The stage controller 85 varies the mounting position of a stage 19 according to the applied position information. A workpiece 17 is mounted on the stage 19.

The optical alignment systems 10, 20 and 30 will be described below. In accordance with the preferred embodiment of the invention, each of the three optical alignment systems are identical in construction. Thus, only the first optical alignment system 10 will be described.

The first optical alignment system 10 comprises a light source 11 connected to an optical fiber 12 for transmitting the light emitted from the light source 11. A filter 13 receives the light from the optical fiber 12 and transmits only that frequency of light to which a photoconductive material is not sensitive. A first lens 14 is provided for enlarging the filtered light to a proper size. A light beam splitter 15 then transmits the light beam emitted from the first lens 14 according to a mounting state. A second lens 16 concentrates the light emitted from the light beam splitter 15 and transmits it in the direction of a stage 19 holding a workpiece 17. The workpiece 17, which consists of an inscribed alignment mark, is thus exposed to the light concentrated by the second lens 16.

The operation of the alignment device for an exposure system using a CCD camera in accordance with the first preferred embodiment of the present invention will be explained below. The light emitted from the light source 11, via the optical fiber 12, is incident to the filter 13. The component of light which exposes the photoconductive material is filtered out by the filter 13. The filtered light is then transmitted incident to the first lens 14 and projected to the light beam splitter 15. The light which passes through the light beam splitter 15 is concentrated by the second lens 16 and exposed on the workpiece 17.

Figure 2A:
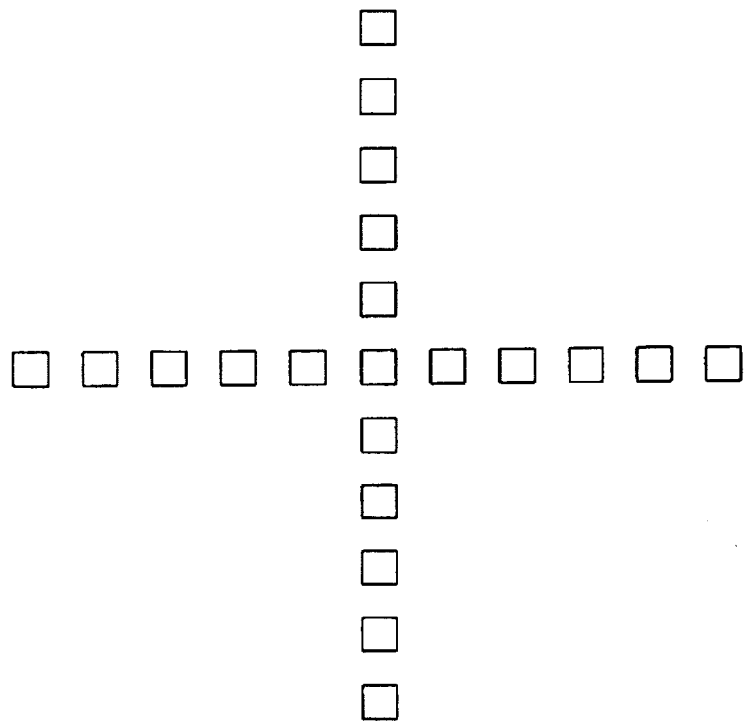
FIG. 2A is a plan view illustrating an alignment mark used for an alignment device in accordance with a preferred embodiment of the present invention.
Figure 2B:
FIG. 2B is a sectional view illustrating an alignment mark used for an alignment device in accordance with a preferred embodiment of the present invention.

The alignment mark formed on the workpiece 17, as illustrated in FIGS. 2A and 2B, has a rugged section. Thus, the light exposed on the workpiece 17, on which the alignment mark 101 is formed, is reflected off of the workpiece and back so that the reflected light is incident to the light beam splitter 15. The light reflected from the light beam splitter 15 is incident to the prism 40. The second and the third optical alignment systems 20 and 30 operate in the same way as the first optical alignment system 10, and produce corresponding alignment light through each separate optical path.

The alignment lights 100, 200 and 300 emitted from a plurality of optical alignment systems 10, 20 and 30 are incident to corresponding reflective surfaces of the prism 40. Thus the alignment lights 100, 200 and 300 corresponding to the alignment marks 101, 201 and 301 formed on the workpiece, are incident to each reflective surface of the prism 40 as illustrated in FIG. 3.

Figure 3:
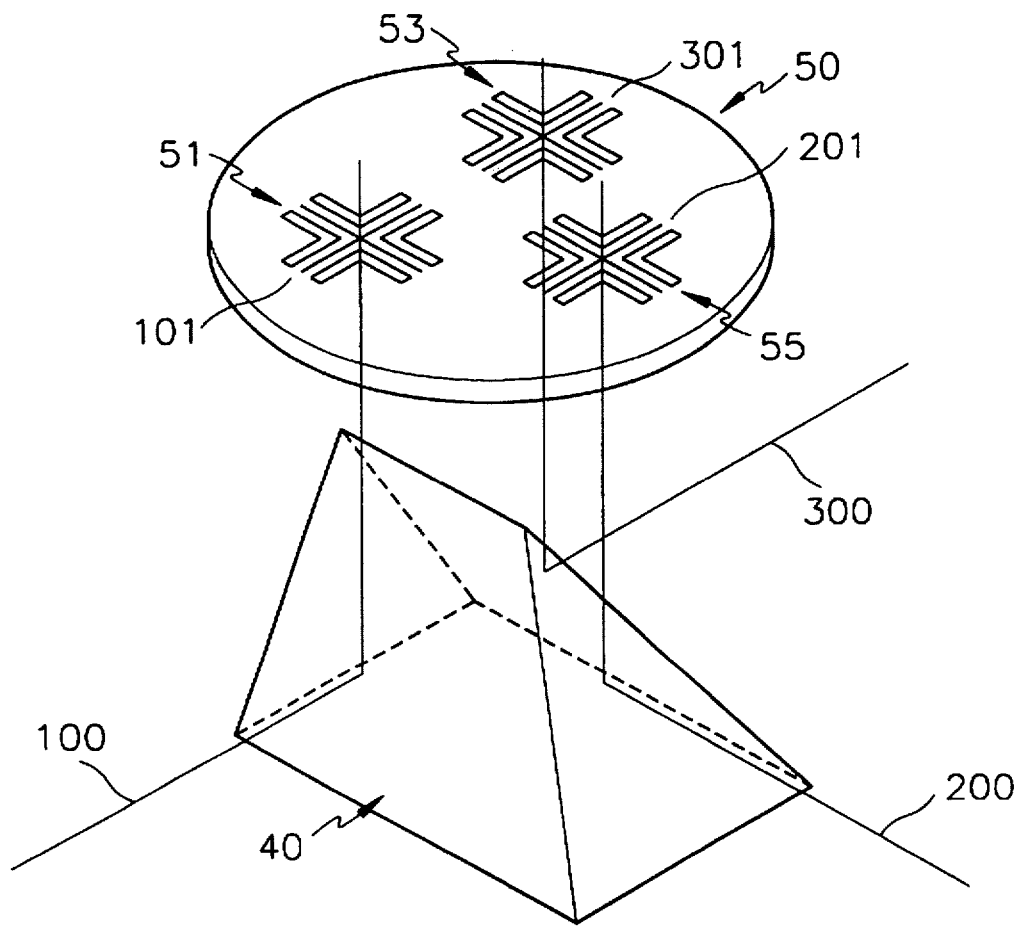
FIG. 3 is a view illustrating a mask on which a reference mark is inscribed and a prism used for an alignment device in accordance with a preferred embodiment of the present invention.
Figure 4:
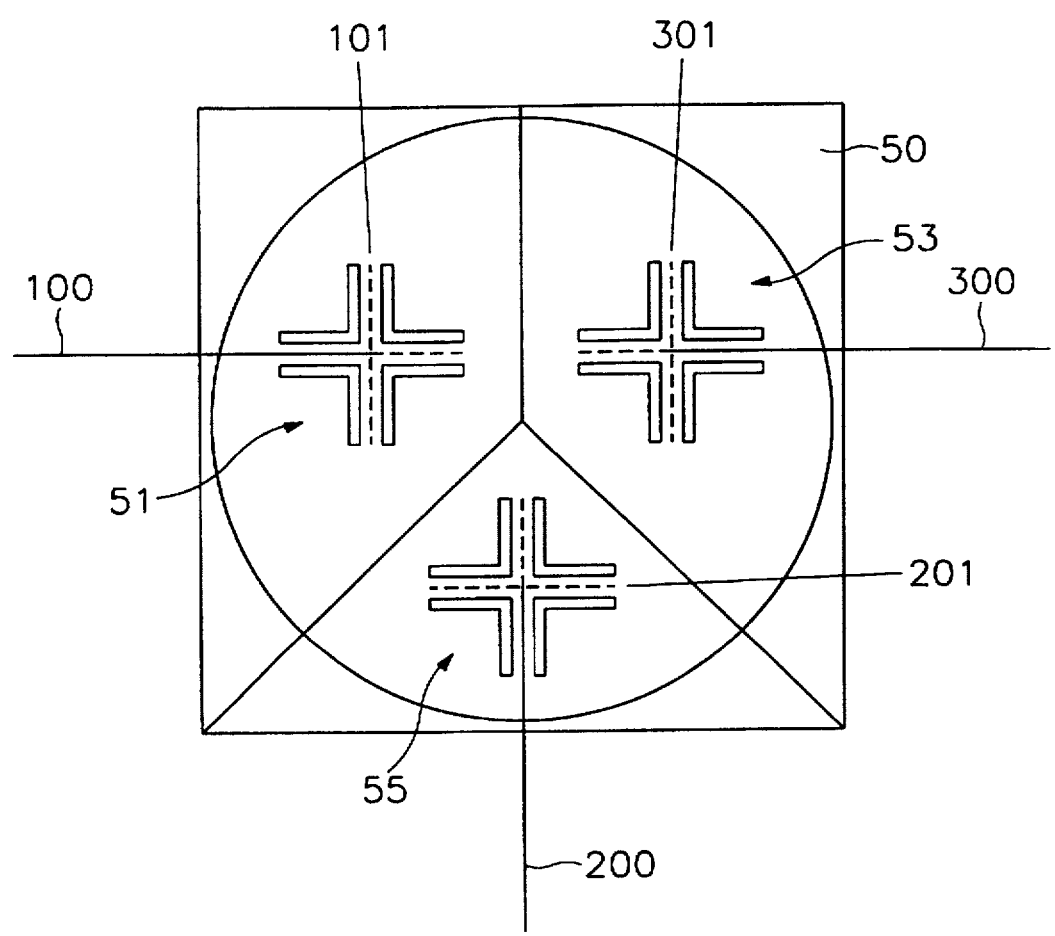
FIG. 4 is a plan view illustrating a mask on which a reference mark and an alignment mark, used for an alignment device in accordance with a preferred embodiment of the present invention, are overlapped.

In accordance with the preferred embodiment of the present invention, the prism 40 is a trigonal prism of which one section is cut off in a slant as illustrated in FIG. 3. Referring to FIG. 3, a plurality of alignment lights 100, 200 and 300 emitted from a plurality of optical alignment systems 10, 20 and 30 mounted in three directions, are reflected by each reflective surface of the prism 40. Once reflected, the lights 100, 200 and 300 form an image on the screen 50 positioned over the prism 40. At this time, the alignment marks 101, 201 and 301 reflected by the prism 40 which form the image on the screen 50, overlap respective reference marks 51, 53 and 55. These reference marks are originally formed on the screen 50. The resulting image of the alignment marks 101, 201 and 301 overlapping the reference marks 51, 53 and 55 is illustrated in FIG. 4. The marks indicated by dotted lines in FIG. 4 represent the alignment marks 101, 201 and 301, while the three reference marks 51, 53 and 55 are indicated by full lines. As described, the alignment marks overlapped by the respective reference marks form the image on the screen 50.

The light which forms the image on the screen 50 is inputted to the CCD camera 70 through the image formation lens 60 (FIG. 1). That is, image formation light having the image corresponding to the alignment marks 101, 201 and 301, and the reference marks 51, 53 and 55 which form the image on the screen 50, is inputted to the CCD camera 70. The light is converted into an electric signal and then processed according to an image processing procedure in image processor 83. The image processor 83 calculates a position difference between the reference marks 51, 53 and 55, and the alignment marks 101, 201 and 301 according to a signal outputted from the CCD camera 70 representing the image formation light. The processor 83 then calculates a present position of the workpiece 17 on which the alignment mark is inscribed. Next, the processor 83 determines the change in position coordinates to precisely bring the workpiece to the position where it should have been originally positioned.

When the light of which image formed on the screen 50 is inputted into the CCD camera 70, through the image formation lens 60, the magnification of the inputted image is changed to more accurately search for the alignment mark in the image formed on the CCD camera 70. Unlike the conventional technique, the preferred embodiment of the present invention utilizes a zoom lens including a control 65 to change the magnification. The image formation lens 60, for forming the image passing through the screen 50 on the CCD camera 70, is made of the zoom lens. This lens is changed to the high magnification for accurate alignment. The alignment is performed as an object is observed under low magnification by a microscope, at first, and the magnification is then gradually changed to the high magnification for a more accurate search.

However, predetermined discontinuous steps are made to change the magnification of the zoom lens 60 in order to make the image processing easier according to the circumstances. The image processing is simplified by the magnification change according to the discontinuous steps. That is to say, a relation between the coordinate change of the alignment obtained from the image processing and the coordinate change of the actual alignment mark may be easily defined if the magnification change is not continuous when the coordinates of the alignment mark is defined in the image processing procedure. But, this relation may not be easily defined if the magnification change is continuous. That is to say, the coordinate change value obtained from the image processing result can be converted into the coordinate change value of the actual alignment mark only when a user knows exactly the magnification value for every case. The user will thus be able to place the workpiece 17 on the stage 19 in the proper position throughout this procedure. As described above, the magnification can be changed by changing the magnification of the zoom lens 60 without inserting or removing an additional lens.

In response to the image signal measured by the CCD camera according to the above-mentioned operation, the image processor 83 transmits the calculation result to the monitor 80 which displays the calculation result. In addition, the monitor 80 displays the difference between the alignment marks 101, 201 and 301, of which the image is formed, and the reference marks 51, 53 and 55. In this way, the system searches for the precise position.

In addition, the position information corresponding to the position of the workpiece 17 on the stage 19 is provided to the stage controller 85 according to the processed result. The stage controller 85 changes the position of the stage 19 according to the position information produced from the image processor 83, thereby placing the workpiece 17 in the precise position.

Figure 5:
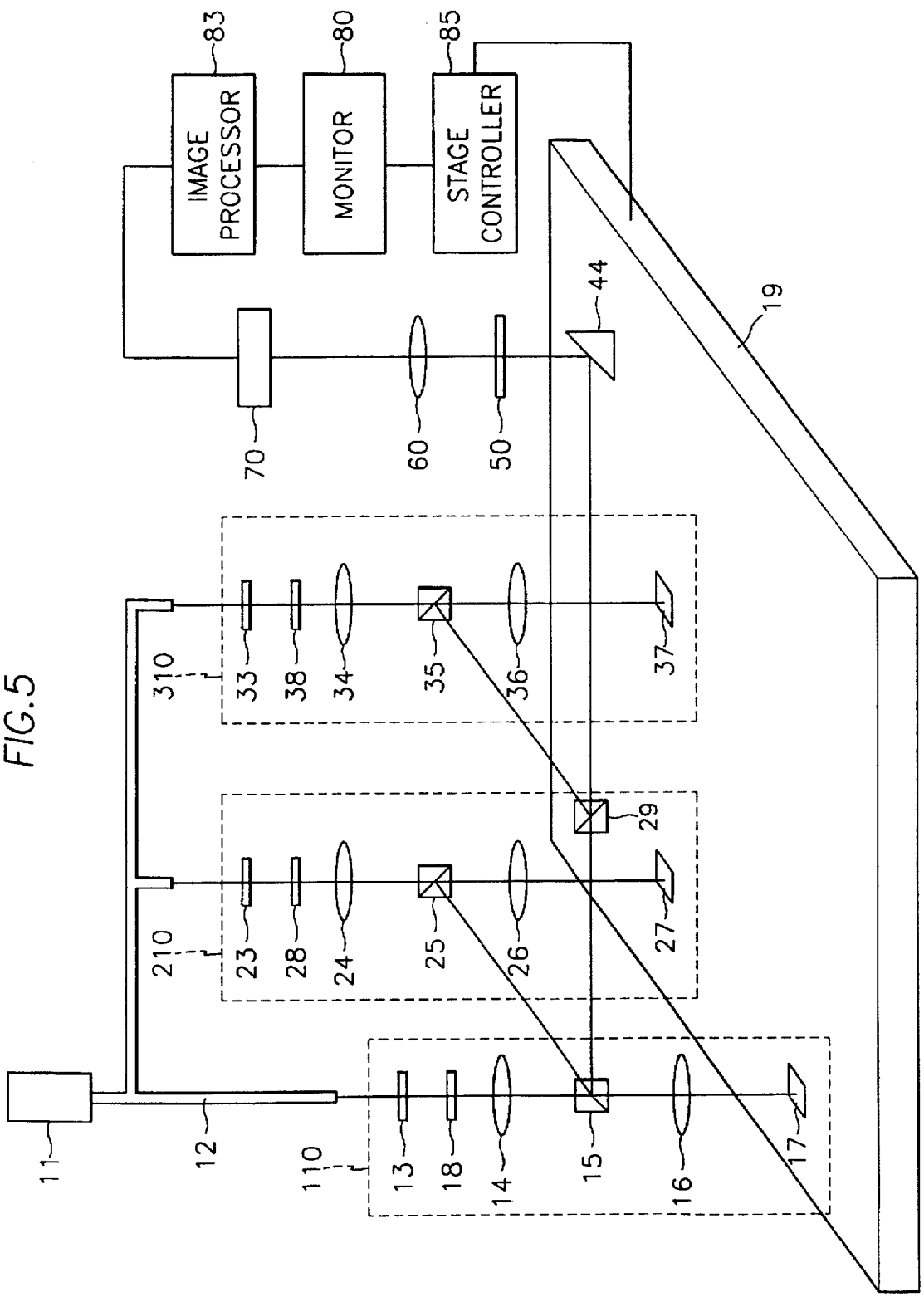
FIG. 5 is a perspective view illustrating an alignment device using a shutter, instead of a prism, in accordance with a second preferred embodiment of the present invention.

The operation of the alignment device for an exposure system using a CCD camera in accordance with the second preferred embodiment of the present invention is explained with reference to FIG. 5 as follows. The alignment device for an exposure system using a CCD camera in accordance with the second preferred embodiment of the present invention comprises a first, a second and a third optical alignment systems 110, 210 and 310, respectively. Included in the exposure system is a mirror 44. The mirror 44 reflects the alignment lights produced from one of the plurality of optical alignment systems 110, 210 and 310 to the screen 50. Also included in the exposure system is a zoom lens 60, a CCD camera 70, a monitor 80, an image processor 83 and a stage controller 85.

The optical alignment systems 110, 210 and 310 in accordance with the second preferred embodiment of the present invention each use the same light source 11 which transmits light through an optical fiber 12 to each of the alignment systems. The light received from the optical fiber 12 is filtered in corresponding filters 13, 23 and 33 of each respective alignment system. The filtered light is then passed to shutters 18, 28 and 38 for transmitting the filtered lights according to an ON/OFF state. The light is then transmitted to first lenses 14, 24 and 34, to light beam splitters 15, 25 and 35, to second lenses 16, 26 and 36, and then to workpieces 17, 27 and 37.

The operation of each constructional elements as mentioned above is carried out in the same way as the first preferred embodiment of the present invention. However, the alignment light is formed into an image on the screen 50 using the additional mirror 44 and the shutters 18, 28 and 38 instead of the prism 40.

The difference between the first and the second preferred embodiments is described below. In the first preferred embodiment of the present invention, each optical alignment system forms a separate optical path and the alignment mark is formed into the image on the screen using the prism. However, in the second preferred embodiment of the present invention, a plurality of optical alignment systems form one optical path. This is accomplished by controlling the ON/OFF operation of the shutters 18, 28 and 38 in order to select an alignment light emitted from one of the corresponding optical alignment systems 110, 210 and 310 in which the shutters are mounted. From the selected alignment light, the corresponding alignment mark is formed into the image on the screen 50.

For example, consider the case when only the workpiece 17 is intended to be exposed to the light source 11 and the alignment light emitted from the first optical alignment system 110 forms the image on the CCD camera. In this case, the light emitted from the light source 11 is exposed on the workpiece 17 by opening the shutter 18 of the first optical alignment system 110. The light emitted from the light source 11 is controlled not to expose the workpieces 27 and 37 by closing the shutters 28 and 38 of the second and the third optical alignment systems 210 and 310. The alignment light emitted from the first optical alignment system 110 is reflected by the mirror 44. The image thereof is formed on the screen 50 on which the reference mark is formed and inputted into the CCD camera.

In addition, when the user wants to form the image of the alignment light emitted from the third optical alignment system 310, the light may be exposed on the workpiece 37 by opening only the shutter 38. The light exposed on the workpiece 37 is reflected to the light beam splitter 29, and the image thereof is formed on the screen 50 through the mirror 44. After the image is formed on the CCD camera 70, the operation for sensing the position change of the workpiece on which the alignment mark is formed is the same as the first preferred embodiment of the present invention.

Figure 6:
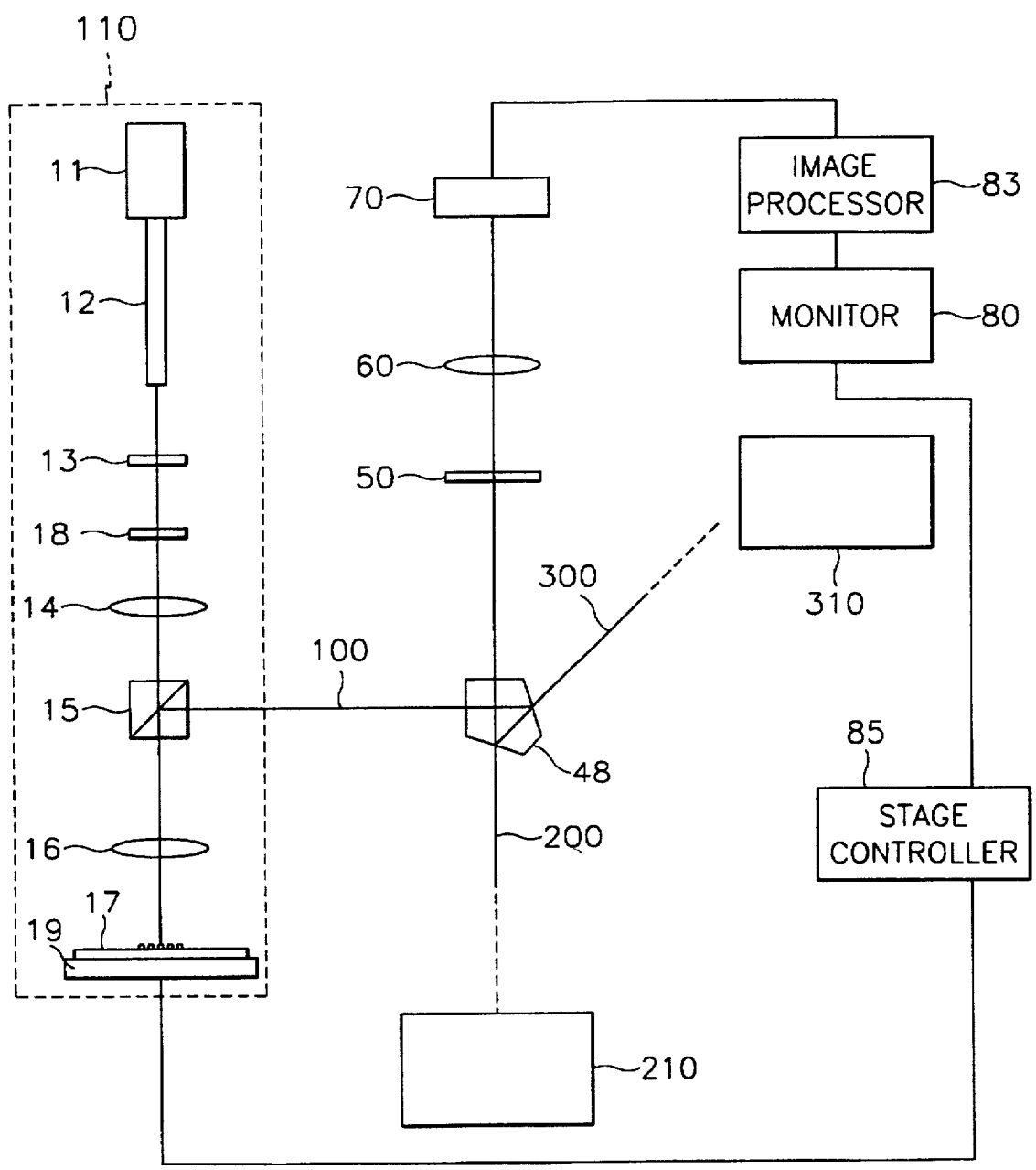
FIG. 6 is a perspective view illustrating an alignment device using a CCD camera and a pentaprism in accordance with a third preferred embodiment of the present invention.

The operation of the alignment device for an exposure system using a CCD camera in accordance with the third preferred embodiment of the present invention is explained with reference to FIG. 6 as follows. The alignment device for an exposure system using a CCD camera in accordance with the third preferred embodiment of the present invention includes a first, a second and a third optical alignment systems 110, 210 and 310, respectively. Included in the exposure system is a pentaprism 48. The pentaprism 48 reflects, through one optical path, the alignment lights produced from the first, the second and the third optical alignment systems 110, 210 and 310 to a screen 50. Also included in the exposure system is a zoom lens 60, a CCD camera 70, a monitor 80, an image processor 83, and a stage controller 85.

The construction of the optical alignment systems 110, 210 and 310 in accordance with the third preferred embodiment of the present invention is the same as the second preferred embodiment of the present invention. The operation of the third preferred embodiment of the present invention is the same as the second preferred embodiment of the present invention in that a plurality of optical alignment systems have a common optical path and the alignment light is inputted to the CCD camera. However, the difference between the second and the third preferred embodiments of the present invention lies in the fact that the optical path of each optical alignment system 110, 210 and 310 is separately constructed. The light inputted through the separate optical paths is emitted through one path using the pentaprism 48, and is then inputted into the CCD camera 70.

Accordingly, the ON/OFF operation of the shutters 18, 28 and 38 mounted in the plurality of optical alignment systems 110, 210 and 310 is controlled such that only the alignment light corresponding to the selected optical alignment system is emitted. The selected alignment light is produced on one output path through the pentaprism 48, and the image thereof is formed on the CCD camera 70. After the image is formed on the CCD camera 70, the operation for sensing the position change of the workpiece on which the alignment mark is formed, is the same as the first preferred embodiment of the present invention.

In the first, the second and the third preferred embodiments of the present invention, the position change of the workpiece on which the reference mark is formed, is sensed using the screen on which the reference mark is formed. According to another embodiment of the present invention, however, a data corresponding to the reference mark is stored in the image processor mounted in the CCD camera. After the image of the alignment mark from the screen 50 is formed, the position change of the workpiece may be sensed by comparing the inputted alignment mark with the stored reference mark.

As described above, the effect of the present invention lies in an alignment device, for an exposure system having a CCD camera, which can determine the precise alignment position of a workpiece. This is performed by varying the magnification of alignment light emitted from a plurality of optical alignment systems. The alignment light is then transmitted to a prism, through a zoom lens and then to a single CCD camera which forms the image.

Other embodiments of the invention will be apparent to those skilled in the art from consideration of the specification and practice of the invention as disclosed herein. It is intended that the specification and examples be considered as exemplary only, with the true scope and spirit of the invention being indicated by the following claims.

What is claimed is:

1. An alignment device for an exposure system comprising:
    a plurality of optical alignment systems, each alignment system producing an alignment light through an optical path, and wherein the alignment light corresponds to an alignment mark formed on a workpiece;
    a screen;
    a prism, having a plurality of reflective surfaces, for reflecting the plurality of alignment lights and directing the alignment lights to the screen;
    a zoom lens for forming an image from the alignment lights passing through the screen, the image corresponding to the alignment mark;
    a control to discontinuously change the magnification of the zoom lens;
    a CCD camera for converting the alignment lights, which are incident through the zoom lens, into corresponding image information and producing an image signal;
    an image processor for storing a reference mark corresponding to an alignment position of the workpiece and for producing a position change signal corresponding to a position change of the workpiece after calculating: (1) a difference between the reference mark and the alignment mark according to image information produced from the CCD camera; and (2) a present position signal corresponding to the present position of the workpiece;
    an information display for displaying information corresponding to an image signal produced from the image processor; and
    a stage controller for moving a stage on which the workpiece is placed according to the position change signal produced from the image processor.

2. The alignment device of claim 1, wherein the plurality of optical alignment systems include:
    a light source which emits light;
    an optical fiber which transmits the light emitted from the light source;
    a filter which filters from the light transmitted through the optical fiber light a component which exposes a photoconductive material to light;
    a first lens which enlarges the filtered light to an enlarged size;
    a second lens which concentrates the light emitted through the first lens to expose the workpiece to the light concentrated by the second lens, wherein the alignment mark is inscribed on the workpiece; and
    a light beam splitter which produces the alignment light on a corresponding optical path from the light reflected off of the workpiece through the second lens.

3. An alignment device for an exposure system comprising:
    a plurality of optical alignment systems, each having an operation state that is selectively changed, and a light source for producing an alignment light through one optical path, and wherein the alignment light corresponds to an alignment mark formed on a workpiece;
    a screen;
    a zoom lens for forming an image from the alignment lights passing through the screen, the image corresponding to the alignment mark;
    a control to discontinuously change the magnification of the zoom lens;
    a CCD camera for converting the alignment lights, which are incident through the zoom lens, into corresponding image information to produce an image signal;
    an image processor for storing a reference mark corresponding to an alignment position of the workpiece and for producing a position change signal corresponding to a position change of the workpiece after calculating: (1) a difference between the reference mark and the alignment mark according to image information produced from the CCD camera; and (2) a present position signal corresponding to the present position of the workpiece;
    an information display for displaying information corresponding to an image signal produced from the image processor; and
    a stage controller for moving a stage on which the workpiece is placed according to the position change signal produced from the image processor.

4. The alignment device of claim 3, wherein the plurality of optical alignment systems include:

a light source which emits light;

an optical fiber which transmits the light emitted from the light source;

a filter which filters from the light transmitted through the optical fiber a component which exposes a photoconductive material to light;

a shutter which transmits the filtered light according to whether the state of the shutter is open or closed;

a first lens which enlarges the filtered light transmitted through the shutter to an enlarged size;

a second lens which concentrates the light emitted through the first lens to expose the workpiece to the light concentrated by the second lens, wherein the alignment mark is inscribed on the workpiece; and a light beam splitter which produces the alignment light on a corresponding optical path from the light reflected off of the workpiece through the second lens.

5. The alignment device for an exposure equipment using a CCD camera of claim 3, further including a mirror which reflects the alignment light of the optical alignment system produced through one optical path and producing the same on the screen.

6. The alignment device for an exposure system comprising:

a plurality of optical alignment systems having an operational state that is selectively changed, each of the systems producing an alignment light through one optical path, and wherein the alignment light corresponds to an alignment mark formed on a workpiece;

a screen;

a pentaprism for directing the plurality of alignment lights to the screen through one optical path;

a zoom lens for forming an image from the alignment lights passing through the screen, the image corresponding to the alignment mark;

a control to discontinuously change the magnification of the zoom lens;

a CCD camera for converting the alignment lights, which are incident through the zoom lens, into corresponding image information and produces an image signal;

an image processor for storing a reference mark corresponding to an alignment position of the workpiece and for producing a position change signal corresponding to a position change of the workpiece after calculating: (1) a difference between the reference mark and the alignment mark according to image information produced from the CCD camera; and (2) a present position signal corresponding to the present position of the workpiece;

an information display for displaying information corresponding to an image signal produced from the image processor; and a stage controller for moving a stage on which the workpiece is placed according to the position change signal produced from the image processor.

7. The alignment device of claim 6, wherein the plurality of optical alignment systems include:

a light source which emits predetermined light;

an optical fiber which transmits the light emitted from the light source;

a filter which filters from the light transmitted through the optical fiber a component which exposes a photoconductive material to light;

a shutter which transmits the filtered light according to whether the stage of the shutter is open or closed;

a first lens enlarges the filtered light transmitted through the shutter to an enlarged size;

a second lens which concentrates the light emitted through the first lens to expose the workpiece to the light concentrated by the second lens, wherein the alignment mark is inscribed on the workpiece; and a light beam splitter which directs the alignment light on a corresponding optical path from the light reflected off of the workpiece through the second lens.

* * * * *